(12) United States Patent
Luo et al.

(10) Patent No.: US 11,358,196 B2
(45) Date of Patent: Jun. 14, 2022

(54) ANNEALING AND DRAWING DEVICE FOR OXYGEN-FREE COPPER TUBE USED FOR MOBILE PHONE HEAT PIPE WITH LARGE DIAMETER-WALL THICKNESS RATIO

(71) Applicant: Jiangxi Naile Copper Co., Ltd., Jiangxi (CN)

(72) Inventors: Qiliang Luo, Jiangxi (CN); Jinlong Liu, Jiangxi (CN)

(73) Assignee: Jiangxi Naile Copper Co., Ltd., Jiangxi (CN)

( * ) Notice: Subject to any disclaimer, the term of this patent is extended or adjusted under 35 U.S.C. 154(b) by 145 days.

(21) Appl. No.: 16/818,789

(22) Filed: Mar. 13, 2020

(65) Prior Publication Data
US 2021/0016335 A1     Jan. 21, 2021

(30) Foreign Application Priority Data

Jul. 17, 2019   (CN) .......................... 201910645417.6

(51) Int. Cl.
| | | |
|---|---|---|
| *B21C 1/22* | (2006.01) | |
| *B21C 1/32* | (2006.01) | |
| *B21C 47/04* | (2006.01) | |
| *C22F 1/08* | (2006.01) | |
| *B21C 47/34* | (2006.01) | |
| *H05K 7/20* | (2006.01) | |

(52) U.S. Cl.
CPC .................. *B21C 1/22* (2013.01); *B21C 1/32* (2013.01); *B21C 47/04* (2013.01); *C22F 1/08* (2013.01); *B21C 47/34* (2013.01); *H05K 7/20336* (2013.01)

(58) Field of Classification Search
CPC .. B21C 47/04; B21C 4/34; B21C 1/02; B21C 1/12; B21C 1/16; B21C 3/06; B21C 3/12; B21C 1/22; B21C 1/32; C22F 1/08; H05K 7/20336
USPC .................................................. 72/274, 248
See application file for complete search history.

(56) References Cited

U.S. PATENT DOCUMENTS 2,771,934 A * 11/1956 Payne .................... B21D 11/06
                                                        72/20.3
3,260,099 A *  7/1966 Elge .......................... B21C 1/30
                                                        72/422
3,794,803 A *  2/1974 Valdeck .................. B21C 37/08
                                                        219/61

* cited by examiner

*Primary Examiner* — Jessica Cahill
*Assistant Examiner* — Smith Oberto Bapthelus
(74) *Attorney, Agent, or Firm* — Christopher M. Scherer; DeWitt LLP

(57) ABSTRACT

An annealing and drawing device for an oxygen-free copper tube used for a mobile phone heat pipe with a large diameter-wall thickness ratio, a drawing die is installed in a box body. An annealing tube is installed between the drawing die and the box body; a fixing plate is disposed on a side of the drawing die; a supporting roller is rotatably connected to the fixing plate. A tension adjusting mechanism is disposed on a side of the supporting roller. An outer side of an end of the box body is provided with a mounting plate. A supporting frame is fixed on a side of an upper end of the mounting plate, a servo motor is fixed at an upper end of the supporting frame, and a rotating shaft is fixed at an end of an output shaft of the servo motor. The rotating shaft is in key joint with a winding wheel.

6 Claims, 4 Drawing Sheets

ANNEALING AND DRAWING DEVICE FOR OXYGEN-FREE COPPER TUBE USED FOR MOBILE PHONE HEAT PIPE WITH LARGE DIAMETER-WALL THICKNESS RATIO

CROSS-REFERENCE TO RELATED APPLICATIONS

The present application claims priority to Chinese Patent Application No. 201910645417.6, filed Jul. 17, 2019, the content of which is incorporated herein by reference in its entirety.

TECHNICAL FIELD

The present invention belongs to the technical field of oxygen-free copper tube processing equipment for mobile phone heat pipes, and particularly relates to an annealing and drawing device for an oxygen-free copper tube used for a mobile phone heat pipe with a large diameter-wall thickness ratio.

BACKGROUND

At present, there are diversified oxygen-free copper tubes for mobile phone heat pipes in the market. Usually, outer diameter and wall thickness are used to judge a service performance of oxygen-free copper tubes for mobile phone heat pipes. A product with a large outer diameter and a small wall thickness has obviously superior performances. That is, a diameter-wall thickness ratio of a mobile phone heat pipe is a substantive index for measuring a heat dissipation performance of the mobile phone heat pipe.

The oxygen-free copper tube for the mobile phone heat pipe is produced by using a drawing process. The mobile phone heat pipe is subjected to work hardening during the drawing process, and thus the oxygen-free copper tube for the heat pipe needs to be annealed before being drawn. The existing oxygen-free copper tube for the mobile phone heat pipe generally passes through an annealing device before being drawn. The annealing of the copper tube is inhomogeneous due to an inhomogeneous internal temperature and a large space of the annealing device, which affects a subsequent drawing process. Moreover, the energy consumption is large, and a cost is high. By a tractive force, the oxygen-free copper tube for the heat pipe passes through a drawing die for drawing, but due to a small diameter and a large length of the oxygen-free copper tube for the heat pipe, looseness may occur in the drawing process of the oxygen-free copper tube for the heat pipe, and defects and the like occur easily. Therefore, an annealing and drawing device for an oxygen-free copper tube used for a mobile phone heat pipe, which performs homogeneous annealing and has a tension adjusting mechanism, is provided to solve problems in the prior art.

SUMMARY

The present invention provides an annealing and drawing device for an oxygen-free copper tube used for a mobile phone heat pipe with a large diameter-wall thickness ratio to solve problems in the foregoing background that an existing oxygen-free copper tube for the mobile phone heat pipe generally passes through an annealing furnace before being drawn, the annealing of the oxygen-free copper tube for the heat pipe is inhomogeneous due to an inhomogeneous internal temperature in a large space of the annealing furnace, which affects a subsequent drawing process; moreover, the energy consumption is large, and cost is high; by a tractive force, the oxygen-free copper tube for the heat pipe passes through a drawing die for drawing, but due to a small diameter and a large length of the oxygen-free copper tube for the heat pipe, looseness may occur in the drawing process of the oxygen-free copper tube for the heat pipe, and defects occur easily.

To achieve the foregoing objective, the present invention adopts the following technical solutions:

an annealing and drawing device for an oxygen-free copper tube used for a mobile phone heat pipe with a large diameter-wall thickness ratio, including a box body, where a drawing die is installed at the middle in the box body, an annealing tube is installed between the drawing die and an inner wall of the box body, an induction heating wire is wound around the annealing tube, a fixing plate is disposed on a side of the drawing die away from the annealing tube, the fixing plate is installed at a bottom end of the box body, and a supporting roller is rotatably connected to the fixing plate; a tension adjusting mechanism is disposed on a side of the supporting roller away from the drawing die, an outer side of an end of the box body close to the tension adjusting mechanism is provided with a mounting plate, and the mounting plate is mounted on the ground; a supporting frame is fixed on a side of an upper end of the mounting plate, a servo motor is fixed at an upper end of the supporting frame, and a rotating shaft is fixed at an end of an output shaft of the servo motor; the rotating shaft is in key joint with a winding wheel, and an end of the rotating shaft away from the servo motor is provided with a supporting mechanism.

Preferably, the tension adjusting mechanism includes a mounting block, the mounting block is fixed at a bottom end inside the box body, and supporting rods are fixed at four upper corners of the mounting block; a connecting block is disposed between two of the supporting rods, an adjusting roller is rotatably connected between two of the connecting blocks, an upper end of the connecting block is in threaded connection with a connecting bolt, an upper end of the connecting bolt passes through a push plate, an outer side of the connecting bolt is sleeved with a spring, the spring is located between the push plate and the connecting block, the middle of the push plate is rotatably connected with a lead screw through a bearing, an outer side of the lead screw is in threaded transmission connection with a transmission nut, and the transmission nut is embedded in a top end of the box body.

Preferably, both sides of the connecting block are provided with sliding blocks, the sliding blocks slide in sliding grooves, and the sliding grooves are disposed on the supporting rods.

Preferably, a hand wheel is fixed at an upper end of the lead screw, the hand wheel is located above the box body, and a crank is fixed on the hand wheel.

Preferably, the lead screw is in threaded connection with a lock nut, the lock nut is located between the hand wheel and the box body, and a wrench is disposed on the lock nut.

Preferably, the supporting mechanism includes an L-shaped supporting plate, the L-shaped supporting plate is fixed on the mounting plate, an upper end of the L-shaped supporting plate is provided with an arc groove, a bottom end of the arc groove is rotatably connected to a rotating roller, and an end of the rotating shaft away from the servo motor is placed on the rotating roller.

Preferably, openings are disposed in the middle of side walls of front and rear sides of the box body.

Preferably, supporting legs are fixed at lower ends of the box body, and stainless steel bases are welded to lower ends of the supporting legs.

Technical effects and advantages of the present invention: compared with the prior art, an annealing and drawing device for an oxygen-free copper tube used for a mobile phone heat pipe with a large diameter-wall thickness ratio provided by the present invention has the following advantages:

1. In the present invention, the oxygen-free copper tube for the mobile phone heat pipe passes through the annealing tube, and the induction heating wire is wound around the annealing tube. The induction heating wire is induced to heat the annealing tube, so that a temperature of the annealing tube rises to a predetermined annealing temperature, and thus the annealing tube anneals the passing oxygen-free copper tube for the mobile phone heat pipe. The annealing tube has a small size and a uniform heating temperature, and thus the annealing of the oxygen-free copper tube for the mobile phone heat pipe is uniform. The annealing effect is good and energy consumption is low.

2. In the present invention, the lead screw is driven to rotate through the hand wheel, so that the lead screw moves up and down under the driving of the transmission unit, thereby driving the push plate to move up and down. Therefore, the push plate drives the connecting block to move up and down through the connecting bolt, so that the connecting block drives the adjusting roller to move up and down, and thus the adjusting roller presses or loosens the oxygen-free copper tube for the mobile phone heat pipe to adjust the tension thereof. When the oxygen-free copper tube for the mobile phone heat pipe moves on the adjusting roller, if the tightness of the oxygen-free copper tube for the mobile phone heat pipe changes, the adjusting roller is always in close contact with the oxygen-free copper tube for the mobile phone heat pipe under the elasticity of the spring, to tighten the oxygen-free copper tube. This makes the tractive force on the oxygen-free copper tube for the mobile phone heat pipe uniform, and thus a product drawing effect is good.

Figure 1:
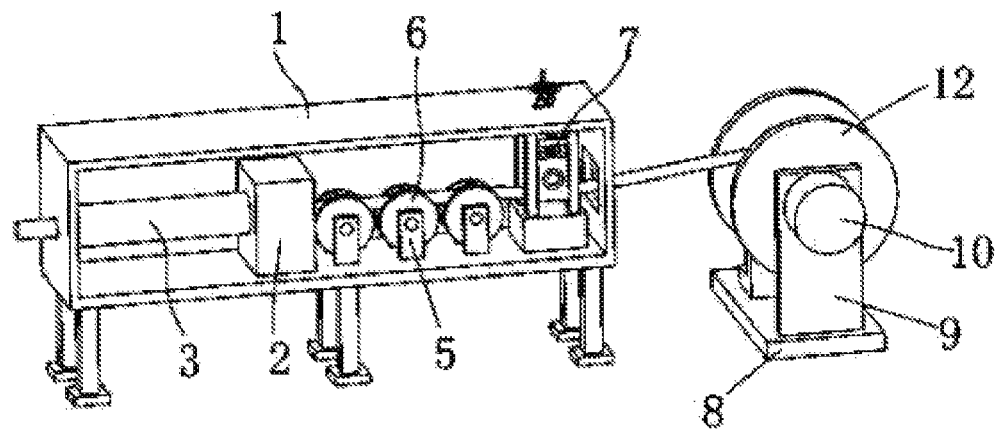
FIG. 1 is a schematic structural diagram of the present invention.

REFERENCE NUMERALS 1. box body; 2. drawing die; 3. annealing tube; 4. induction heating wire; 5. fixing plate; 6. supporting roller; 7. tension adjusting mechanism; 701. mounting block; 702. supporting rod; 703. connecting block; 704. adjusting roller; 705. connecting bolt; 706. push plate; 707. spring; 708. lead screw; 709. transmission nut; 710. sliding block; 711. sliding groove; 712. hand wheel; 713. crank; 714. lock nut; 715. wrench; 8. mounting plate; 9. supporting frame; 10. servo motor; 11. rotating shaft; 12. winding wheel; 13. supporting mechanism; 131. L-shaped supporting plate; 132. arc groove; 133. rotating roller; 14. opening; 15. supporting leg; 16. stainless steel base.

DETAILED DESCRIPTION

The following clearly and completely describes the technical solutions in the embodiments of the present invention with reference to accompanying drawings in the embodiments of the present invention. Apparently, the described embodiments are merely some rather than all of the embodiments of the present invention. The described embodiments are merely used to explain the present invention and are not intended to limit the present invention. All other embodiments obtained by a person of ordinary skill in the art based on the embodiments of the present invention without creative efforts shall fall within the protection scope of the present invention.

Figure 2:
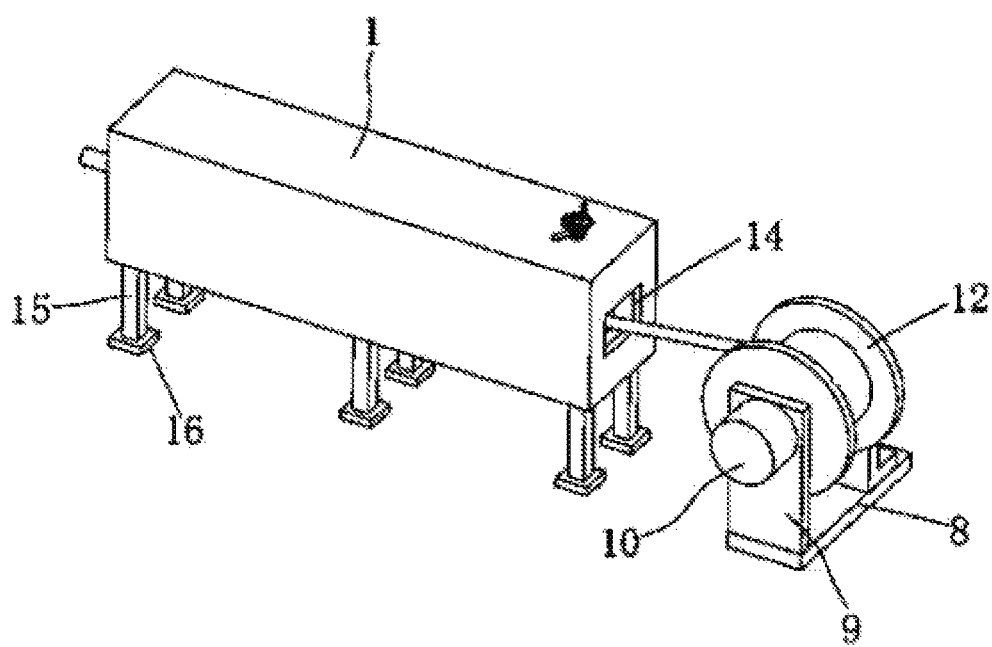
FIG. 2 is a stereoscopic diagram of the present invention.
Figure 3:
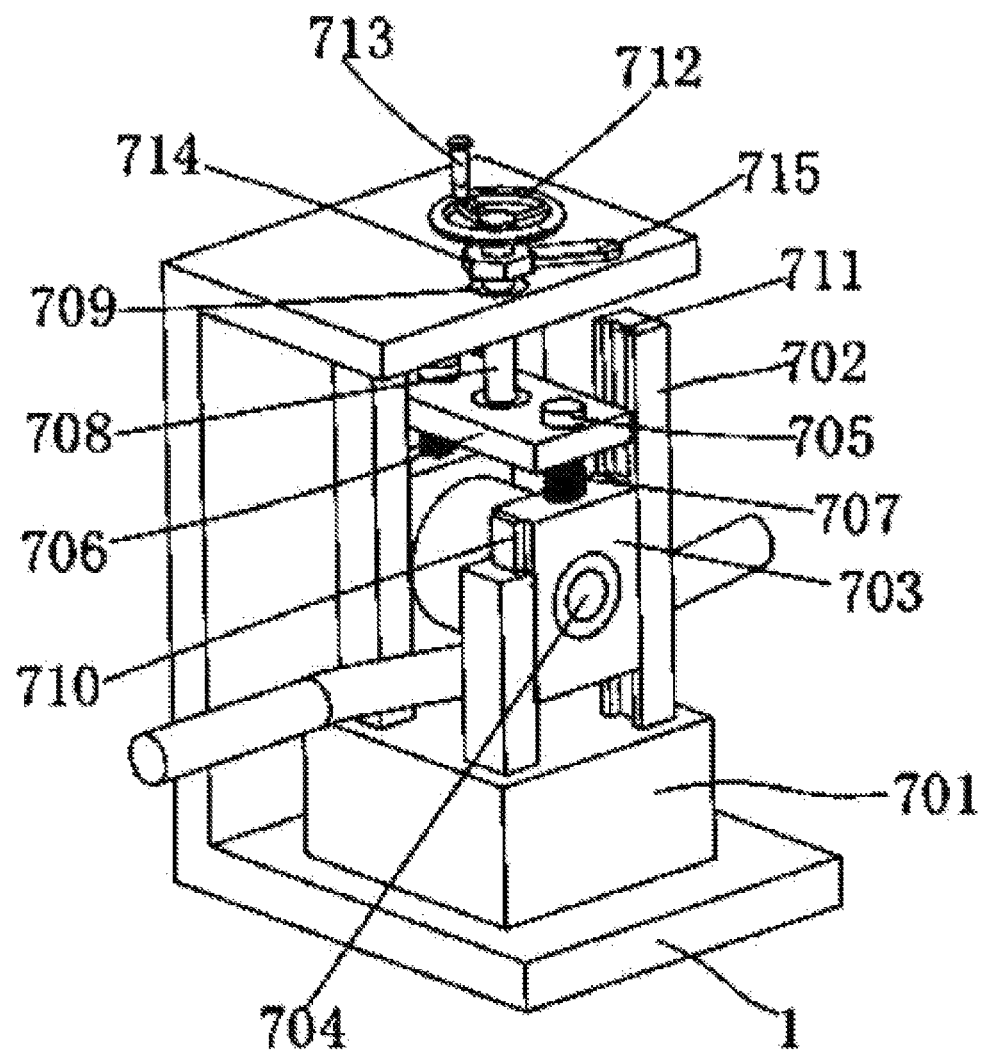
FIG. 3 is a structural diagram of a tension adjusting mechanism of the present invention.
Figure 4:
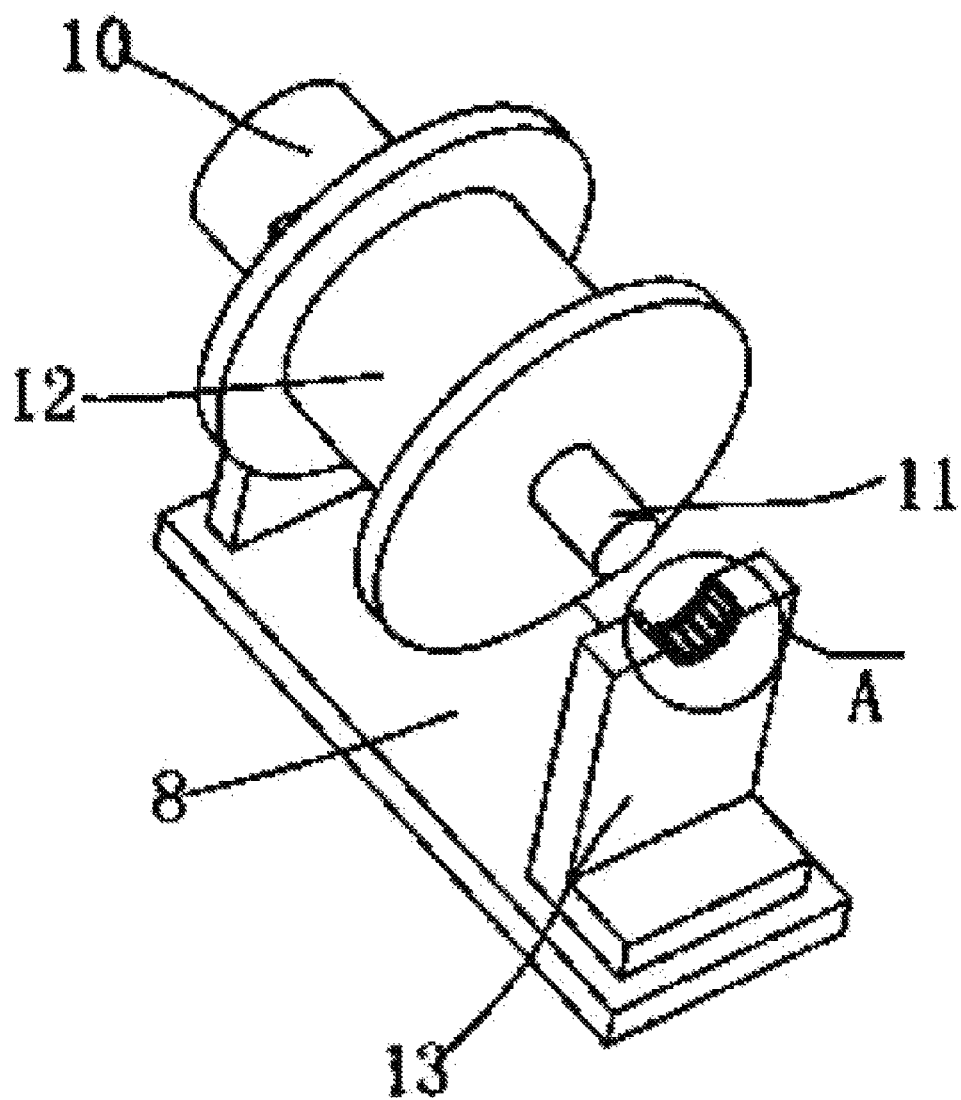
FIG. 4 is a structural diagram of a supporting mechanism of the present invention.
Figure 5:
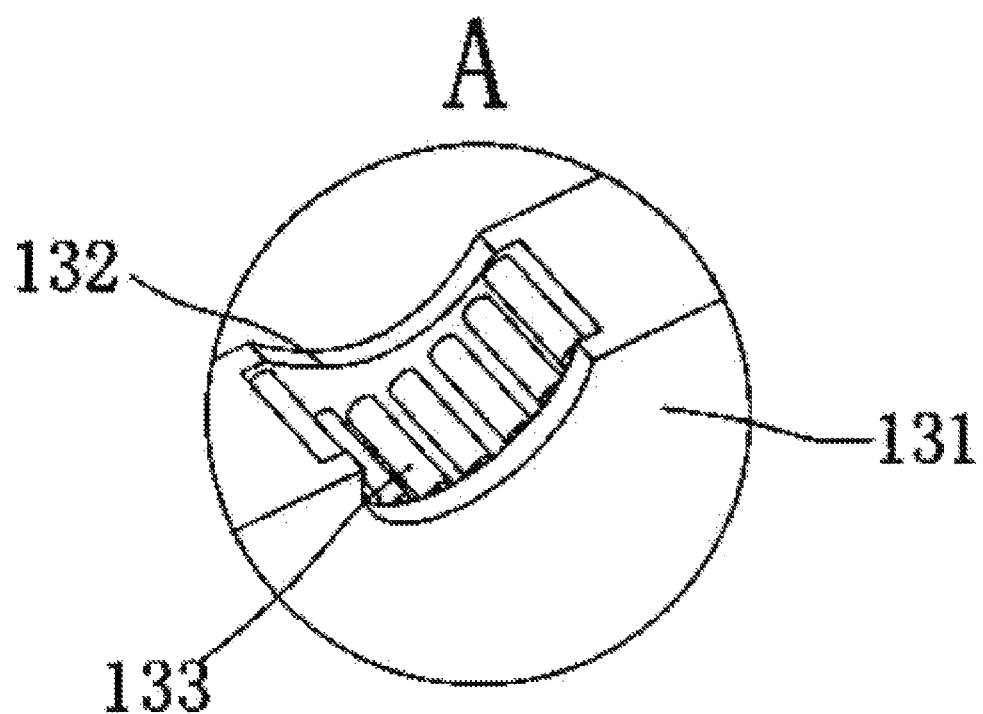
FIG. 5 is an enlarged view of a position A of the present invention.
Figure 6:
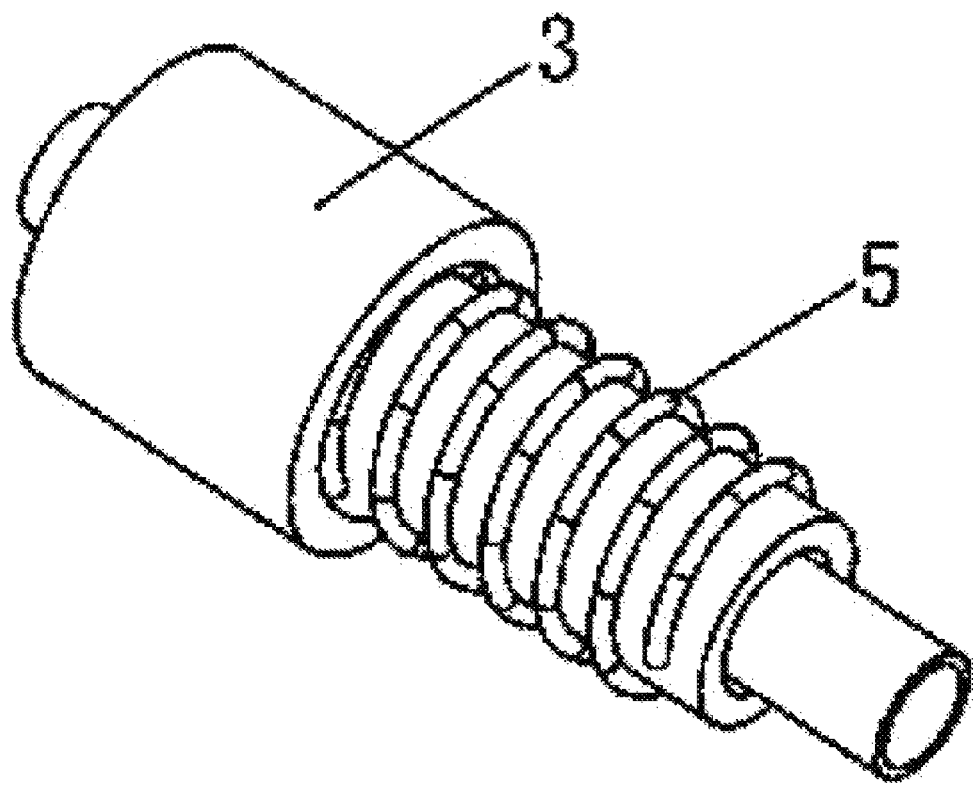
FIG. 6 is an internal structural diagram of an annealing tube of the present invention.

The present invention provides an annealing and drawing device for an oxygen-free copper tube used for a mobile phone heat pipe with a large diameter-wall thickness ratio as shown in FIGS. 1-6, which includes a box body 1, where a drawing die 2 is installed at the middle in the box body 1, an annealing tube 3 is installed between the drawing die 2 and an inner wall of the box body 1, an induction heating wire 4 is wound inside the annealing tube 3, a fixing plate 5 is disposed on a side of the drawing die 2 away from the annealing tube 3, the fixing plate 5 is installed at a bottom end of the box body 1, and a supporting roller 6 is rotatably connected to the fixing plate 5; a tension adjusting mechanism 7 is disposed on a side of the supporting roller 6 away from the drawing die 2, an outer side of an end of the box body 1 close to the tension adjusting mechanism 7 is provided with a mounting plate 8, and the mounting plate 8 is mounted on the ground; a supporting frame 9 is fixed on a side of an upper end of the mounting plate 8, a servo motor 10 is fixed at an upper end of the supporting frame 9, and a rotating shaft 11 is fixed at an end of an output shaft of the servo motor 10; the rotating shaft 11 is in key joint with a winding wheel 12, and an end of the rotating shaft 11 away from the servo motor 10 is provided with a supporting mechanism 13.

Preferably, the tension adjusting mechanism 7 includes a mounting block 701, the mounting block 701 is fixed at a bottom end inside the box body 1, and supporting rods 702 are fixed at four upper corners of the mounting block 701; a connecting block 703 is disposed between two of the supporting rods 702, an adjusting roller 704 is rotatably connected between two of the connecting blocks 703, an upper end of the connecting block 703 is in threaded connection with a connecting bolt 705, an upper end of the connecting bolt 705 passes through a push plate 706, an outer side of the connecting bolt 705 is sleeved with a spring 707, the spring 707 is located between the push plate 706 and the connecting block 703, the middle of the push plate 706 is rotatably connected with a lead screw 708 through a bearing, an outer side of the lead screw 708 is in threaded transmission connection with a transmission nut 709, and the transmission nut 709 is embedded in a top end of the box body 1.

By adopting the foregoing technical solution, the adjusting roller 704 presses or loosens the oxygen-free copper tube for the mobile phone heat pipe to adjust the tension thereof. When the oxygen-free copper tube for the mobile phone heat pipe moves on the adjusting roller 704, if the tightness of the oxygen-free copper tube for the mobile phone heat pipe changes, the adjusting roller 704 is always in close contact with the oxygen-free copper tube for the mobile phone heat pipe under the elasticity of the spring 707, to tighten the oxygen-free copper tube. This makes the tractive force on the oxygen-free copper tube for the mobile phone heat pipe uniform, and thus a product drawing effect is good.

Preferably, both sides of the connecting block 703 are provided with sliding blocks 710, the sliding blocks 710 slide in sliding grooves 711, and the sliding grooves 711 are disposed on the supporting rods 702.

By adopting the foregoing technical solution, the connecting block 703 slides along the sliding groove 711 between the supporting rods 702, thereby reducing friction, facilitating movement and playing a limiting role.

Preferably, a hand wheel 712 is fixed at an upper end of the lead screw 708, the hand wheel 712 is located above the box body 1, and a crank 713 is fixed on the hand wheel 712.

By adopting the foregoing technical solution, it is convenient to rotate the hand wheel 712 by hand through the crank 713, which is convenient to operate and saves labor.

Preferably, the lead screw 708 is in threaded connection with a lock nut 714, the lock nut 714 is located between the hand wheel 712 and the box body 1, and a wrench 715 is disposed on the lock nut 714.

By adopting the foregoing technical solution, the lead screw 708 is locked or loosened by the lock nut 714 through the wrench 715, which is convenient to operate and saves labor.

Preferably, the supporting mechanism 13 includes an L-shaped supporting plate 131, the L-shaped supporting plate 131 is fixed on the mounting plate 8, an upper end of the L-shaped supporting plate 131 is provided with an arc groove 132, a bottom end of the arc groove 132 is rotatably connected to a rotating roller 133, and an end of the rotating shaft 11 away from the servo motor 10 is placed on the rotating roller 133.

By adopting the foregoing technical solution, the rotating shaft 11 is supported, and the stability of the winding wheel 12 is improved. The arrangement of the rotating roller 133 reduces the friction force between the rotating shaft 11 and the L-shaped supporting plate 131, and reduces energy consumption.

Preferably, openings 14 are disposed in the middle of side walls of front and rear sides of the box body 1.

By adopting the foregoing technical solution, the arrangement of the openings 14 enables the oxygen-free copper tube for the mobile phone heat pipe to pass through the box body 1 conveniently, thus facilitating operations.

Preferably, supporting legs 15 are fixed at lower ends of the box body 1, and stainless steel bases 16 are welded to lower ends of the supporting legs 15.

By adopting the foregoing technical solution, the stability and firmness of installation of the device are improved.

Working principle: The oxygen-free copper tube for the mobile phone heat pipe to be processed first passes through the box body 1 from the opening at one side of the box body 1 and then passes through the annealing tube 3. The induction heating wire 4 in the inner wall of the annealing tube 3 heats the annealing tube 3, and the temperature of the annealing tube 3 is increased to a predetermined annealing temperature. Then the annealing tube 3 anneals the passing oxygen-free copper tube for the mobile phone heat pipe. The annealed oxygen-free copper tube for the mobile phone heat pipe penetrates out of the annealing tube 3 and then passes through the drawing die 2, so that the drawing die 2 draws the oxygen-free copper tube. The drawn oxygen-free copper tube for the mobile phone heat pipe moves forward under the support of the supporting roller 6 and the tractive force, and then passes through the tension adjusting mechanism 7.

The lead screw 708 is driven to rotate through the hand wheel 712, so that the lead screw 708 moves up and down under the driving of the transmission unit 709, thereby driving the push plate 706 to move up and down. Therefore, the push plate 706 drives the connecting block 703 to move up and down through the connecting bolt 705, so that the connecting block 703 drives the adjusting roller 704 to move up and down, and thus the adjusting roller 704 presses or loosens the oxygen-free copper tube for the mobile phone heat pipe to adjust the tension thereof. When the oxygen-free copper tube for the mobile phone heat pipe moves on the adjusting roller 704, if the tractive force borne by the oxygen-free copper tube for the mobile phone heat pipe changes, the adjusting roller 704 is always in close contact with the oxygen-free copper tube for the mobile phone heat pipe under the elasticity of the spring 707, to tighten the oxygen-free copper tube. This makes the tractive force on the oxygen-free copper tube for the mobile phone heat pipe uniform, and thus a product drawing effect is good and the quality is high.

Finally, it should be noted that the above description is only a preferred embodiment of the present invention and is not intended to limit the present invention. Although the present invention has been described in detail with reference to the foregoing embodiments, those skilled in the art can still modify the technical solutions described in the foregoing embodiments, or substitute some of the technical features of the embodiments. Any modifications, equivalent substitutions, improvements, etc. within the spirit and principle of the present invention should fall within the protection scope of the present invention.

What is claimed is:

1. An annealing and drawing device for an oxygen-free copper tube used for a mobile phone heat pipe with a large diameter-wall thickness ratio, comprising a box body, wherein a drawing die is installed inside the box body at a middle of the box body, an annealing tube is installed between the drawing die and an inner wall of the box body, an induction heating wire is wound around the annealing tube, a fixing plate is disposed on a side of the drawing die away from the annealing tube, the fixing plate is installed at a bottom end of the box body, and a supporting roller is rotatably connected to the fixing plate; a tension adjusting mechanism is disposed on a side of the supporting roller away from the drawing die, an outer side of an end of the box body close to the tension adjusting mechanism is provided with a mounting plate, and the mounting plate is mounted on the ground; a supporting frame is fixed on a side of an upper end of the mounting plate, a servo motor is fixed at an upper end of the supporting frame, and a rotating shaft is fixed at an end of an output shaft of the servo motor; the rotating shaft is in key joint with a winding wheel, and an end of the rotating shaft away from the servo motor is provided with a supporting mechanism, wherein the tension adjusting mechanism comprises a mounting block, the mounting block is fixed inside the box body at the bottom end of the box body, and four supporting rods are fixed at four upper corners of the mounting block, respectively; two connecting blocks are disposed such that one of the two connecting blocks is provided between two of the four supporting rods at a same side and another one of the two connecting blocks is provided between the remaining two of the four supporting rods; an adjusting roller is rotatably connected between the two connecting blocks, an upper end of each connecting block is in threaded connection with a connecting bolt, an upper end of the connecting bolt passes through a push plate, an outer side of the connecting bolt is sleeved with a spring, the spring is located between the push plate and the connecting block, a middle of the push plate is rotatably connected with a lead screw through a bearing, an outer side of the lead screw is in threaded transmission connection with a transmission nut, and the transmission nut is embedded in a top end of the box body;

wherein both sides of the connecting block are provided with sliding blocks respectively, the sliding blocks slide in sliding grooves, and the sliding grooves are disposed on the supporting rods.

2. The annealing and drawing device for an oxygen-free copper tube used for a mobile phone heat pipe with a large diameter-wall thickness ratio according to claim 1, wherein a hand wheel is fixed at an upper end of the lead screw, the hand wheel is located above the box body, and a crank is fixed on the hand wheel.

3. The annealing and drawing device for an oxygen-free copper tube used for a mobile phone heat pipe with a large diameter-wall thickness ratio according to claim 2, wherein the lead screw is in threaded connection with a lock nut, the lock nut is located between the hand wheel and the box body, and a wrench is disposed on the lock nut.

4. The annealing and drawing device for an oxygen-free copper tube used for a mobile phone heat pipe with a large diameter-wall thickness ratio according to claim 1, wherein the supporting mechanism comprises an L-shaped supporting plate, the L-shaped supporting plate is fixed on the mounting plate, an upper end of the L-shaped supporting plate is provided with an arc groove, a bottom end of the arc groove is rotatably connected to a rotating roller, and the end of the rotating shaft away from the servo motor is placed on the rotating roller.

5. The annealing and drawing device for an oxygen-free copper tube used for a mobile phone heat pipe with a large diameter-wall thickness ratio according to claim 1, wherein openings are disposed in middles of side walls of front and rear sides of the box body.

6. The annealing and drawing device for an oxygen-free copper tube used for a mobile phone heat pipe with a large diameter-wall thickness ratio according to claim 1, wherein supporting legs are fixed at lower ends of the box body, and stainless steel bases are welded to lower ends of the supporting legs.

* * * * *